United States Patent
Sharbono et al.

(10) Patent No.: US 12,344,955 B2
(45) Date of Patent: Jul. 1, 2025

(54) ELECTROPLATING CO-PLANARITY IMPROVEMENT BY DIE SHIELDING

(71) Applicant: Applied Materials, Inc., Santa Clara, CA (US)

(72) Inventors: Charles Sharbono, Whitefish, MT (US); Paul R. McHugh, Kalispell, MT (US); Gregory J. Wilson, Kalispell, MT (US); John L. Klocke, Kalispell, MT (US); Nolan L. Zimmerman, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/478,252

(22) Filed: Sep. 17, 2021

(65) Prior Publication Data
US 2023/0092346 A1    Mar. 23, 2023

(51) Int. Cl.
| | |
|---|---|
| C25D 7/12 | (2006.01) |
| C25D 5/02 | (2006.01) |
| H01L 21/288 | (2006.01) |
| B33Y 80/00 | (2015.01) |

(52) U.S. Cl.
CPC .............. *C25D 5/022* (2013.01); *C25D 7/12* (2013.01); *H01L 21/2885* (2013.01); *B33Y 80/00* (2014.12)

(58) Field of Classification Search
None
See application file for complete search history.

(56) References Cited

U.S. PATENT DOCUMENTS

| | | | |
|---|---|---|---|
| 2002/0046942 A1* | 4/2002 | Hanson | C25D 17/001 204/224 R |
| 2003/0057099 A1* | 3/2003 | Guldi | C25D 17/001 205/291 |
| 2004/0245094 A1 | 12/2004 | Mchugh et al. | |

(Continued)

FOREIGN PATENT DOCUMENTS

| | | |
|---|---|---|
| JP | 2008088522 A | 4/2008 |
| JP | 2019183223 A | 10/2019 |

(Continued)

OTHER PUBLICATIONS

International Search Report and Written Opinion mailed on Dec. 12, 2022 in International Patent Application No. PCT/US2022/043041, 14 pages.

(Continued)

*Primary Examiner* — Stefanie S Wittenberg
(74) *Attorney, Agent, or Firm* — Kilpatrick Townsend & Stockton LLP

(57) ABSTRACT

Exemplary electroplating systems may include a vessel. The systems may include a paddle disposed within the vessel. The paddle may be characterized by a first surface and a second surface. The first surface of the paddle may be include a plurality of ribs that extend upward from the first surface. The plurality of ribs may be arranged in a generally parallel manner about the first surface. The paddle may define a plurality of apertures through a thickness of the paddle. Each of the plurality of apertures may have a diameter of less than about 5 mm. The paddle may have an open area of less than about 15%.

20 Claims, 10 Drawing Sheets

(56) References Cited

U.S. PATENT DOCUMENTS

| | | | |
|---|---|---|---|
| 2005/0006241 A1* | 1/2005 | McHugh | H01L 21/6723 |
| | | | 205/80 |
| 2005/0056544 A1* | 3/2005 | Liu | C25D 5/028 |
| | | | 205/223 |
| 2007/0151844 A1* | 7/2007 | Wilson | C25D 5/18 |
| | | | 204/230.2 |
| 2009/0013929 A1 | 1/2009 | Yeh et al. | |
| 2012/0199475 A1* | 8/2012 | McHugh | C25D 17/001 |
| | | | 366/343 |
| 2012/0258408 A1* | 10/2012 | Mayer | C25D 17/008 |
| | | | 204/229.5 |
| 2012/0292195 A1* | 11/2012 | Lee | H01L 21/2885 |
| | | | 205/133 |
| 2013/0137242 A1 | 5/2013 | He et al. | |
| 2013/0220819 A1* | 8/2013 | Hall | C25D 5/627 |
| | | | 205/104 |
| 2017/0191180 A1* | 7/2017 | Bergman | C25D 5/022 |
| 2018/0286660 A1* | 10/2018 | Kagajwala | C25D 17/008 |
| 2018/0312991 A1* | 11/2018 | Graham | C25D 17/001 |
| 2019/0085479 A1 | 3/2019 | Banik et al. | |
| 2019/0153611 A1* | 5/2019 | Wilson | C25D 21/10 |
| 2019/0271095 A1* | 9/2019 | Kimura | C25D 21/10 |
| 2023/0407514 A1* | 12/2023 | Fortner | C25D 7/12 |
| 2024/0141541 A1* | 5/2024 | Chua | C25D 5/54 |

FOREIGN PATENT DOCUMENTS

| | | | |
|---|---|---|---|
| JP | 2020534430 A | 11/2020 | |
| WO | 2017031063 A1 | 2/2017 | |

OTHER PUBLICATIONS

JP2024-503908, "Office Action", Feb. 27, 2025, 3 pages.

* cited by examiner

ELECTROPLATING CO-PLANARITY IMPROVEMENT BY DIE SHIELDING

TECHNICAL FIELD

The present technology relates to methods, components, and apparatuses for semiconductor manufacturing. More specifically, the present technology relates to electroplating components and other semiconductor processing equipment.

BACKGROUND

Microelectronic devices, such as semiconductor devices, are fabricated on and/or in wafers or workpieces. A typical wafer plating process involves depositing a metal seed layer onto the surface of the wafer via vapor deposition. A photoresist may be deposited and patterned to expose the seed layer. The wafer is then moved into the vessel of an electroplating processor where electric current is conducted through an electrolyte to the wafer, to apply a blanket layer or patterned layer of a metal or other conductive material onto the seed layer. Examples of conductive materials include permalloy, gold, silver, copper, cobalt, tin, nickel, and alloys of these metals. Subsequent processing steps form components, contacts and/or conductive lines on the wafer. Many aspects of an electroplating process may impact process uniformity, such as irregularities in the electric field due to pattern variations, mass-transfer rates, as well as other process and component parameters. Even minor discrepancies across a substrate may impact downline finishing processes.

Thus, there is a need for improved systems and methods that can be used to produce high quality devices and structures. These and other needs are addressed by the present technology.

SUMMARY

Exemplary electroplating systems may include a vessel. The systems may include a paddle disposed within the vessel. The paddle may be characterized by a first surface and a second surface. The first surface of the paddle may be include a plurality of ribs that extend upward from the first surface. The plurality of ribs may be arranged in a generally parallel manner about the first surface. The paddle may define a plurality of apertures through a thickness of the paddle. Each of the plurality of apertures may have a diameter of less than about 10 mm. The paddle may have an open area of less than about 30%.

In some embodiments, each of the plurality of apertures may extend from the second surface through a top surface of a respective one of the plurality of ribs. The paddle may include a plurality of vertical dividers extending transversely between each of the plurality of ribs. Each of the plurality of apertures may extend from the second surface through a top surface of a respective one of the plurality of vertical dividers. The paddle may define a number of slots, openings, or both slots and openings between at least some of the plurality of ribs. The systems may include a wafer holder movable to position a wafer in the vessel. A distance between the paddle and a face of the wafer holder may be less than about 10 mm. A position of each of the plurality of apertures may correspond with a dense region of a die pattern used with the electroplating system.

Some embodiments of the present technology may encompass methods of electroplating a substrate. The methods may include positioning a substrate into contact with liquid electrolyte within a vessel. The vessel may include a die shield positioned between the substrate and one or more anodes. The die shield may define a plurality of open areas in between at least one shield area. The plurality of open areas may correspond with dense regions of the substrate. The at least one shield area may correspond with sparse regions of the substrate. The methods may include conducting ionic current through the liquid.

In some embodiments, the methods may include identifying a die pattern of the substrate. The die pattern may include a plurality of dense regions and a plurality of sparse regions. The methods may include fabricating the die shield based on the identified die pattern. Fabricating the die shield may include at least one process selected from the group consisting of 3D printing the die shield, molding the die shield, and machining the die shield. The methods may include rotating the substrate while the ionic current is being conducted through the electrolyte. The methods may include adjusting an alignment of the substrate relative to the paddle. The methods may include de-plating the substrate within the vessel. The at least one shield area may include a plurality of shield areas. The plurality of open areas and the plurality of shield areas may be arranged in a repeating pattern about the die shield. The die shield may be incorporated into a weir shield of the vessel.

Some embodiments of the present technology may encompass methods of electroplating a substrate. The methods may include placing a substrate into contact with liquid electrolyte in a vessel. The methods may include conducting ionic current through the liquid electrolyte. The methods may include moving a paddle within the liquid electrolyte below the substrate with a horizontal movement that selectively shields a portion of the substrate. The paddle may be characterized by a first surface and a second surface. The first surface of the paddle may include a plurality of ribs that extend upward from the first surface. The plurality of ribs may be arranged in a generally parallel manner about the first surface. The paddle may define a plurality of apertures through a thickness of the paddle. Each of the plurality of apertures may have a diameter of less than about 10 mm. The paddle may have an open area of less than about 30%.

In some embodiments, the methods may include rotating the substrate while the ionic current is being conducted through the electrolyte. The methods may include adjusting an alignment of the substrate relative to the paddle. The methods may include de-plating the substrate within the vessel. The methods may include identifying a die pattern of the substrate. The die pattern may include a plurality of dense regions and a plurality of sparse regions. The methods may include fabricating the paddle. Each of the plurality of apertures may be generally aligned with one of the dense regions. Each of the plurality of apertures may extend from the second surface through a top surface of a respective one of the plurality of ribs. The paddle may include a plurality of vertical dividers extending transversely between each of the plurality of ribs. Each of the plurality of apertures may extend from the second surface through a top surface of a respective one of the plurality of vertical dividers.

Such technology may provide numerous benefits over conventional systems and techniques. For example, embodiments of the present technology may improve co-planarity across a substrate. In particular, co-planarity may be improved between regions of a wafer that are densely populated with pillars and those regions which are sparsely populated with pillars. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
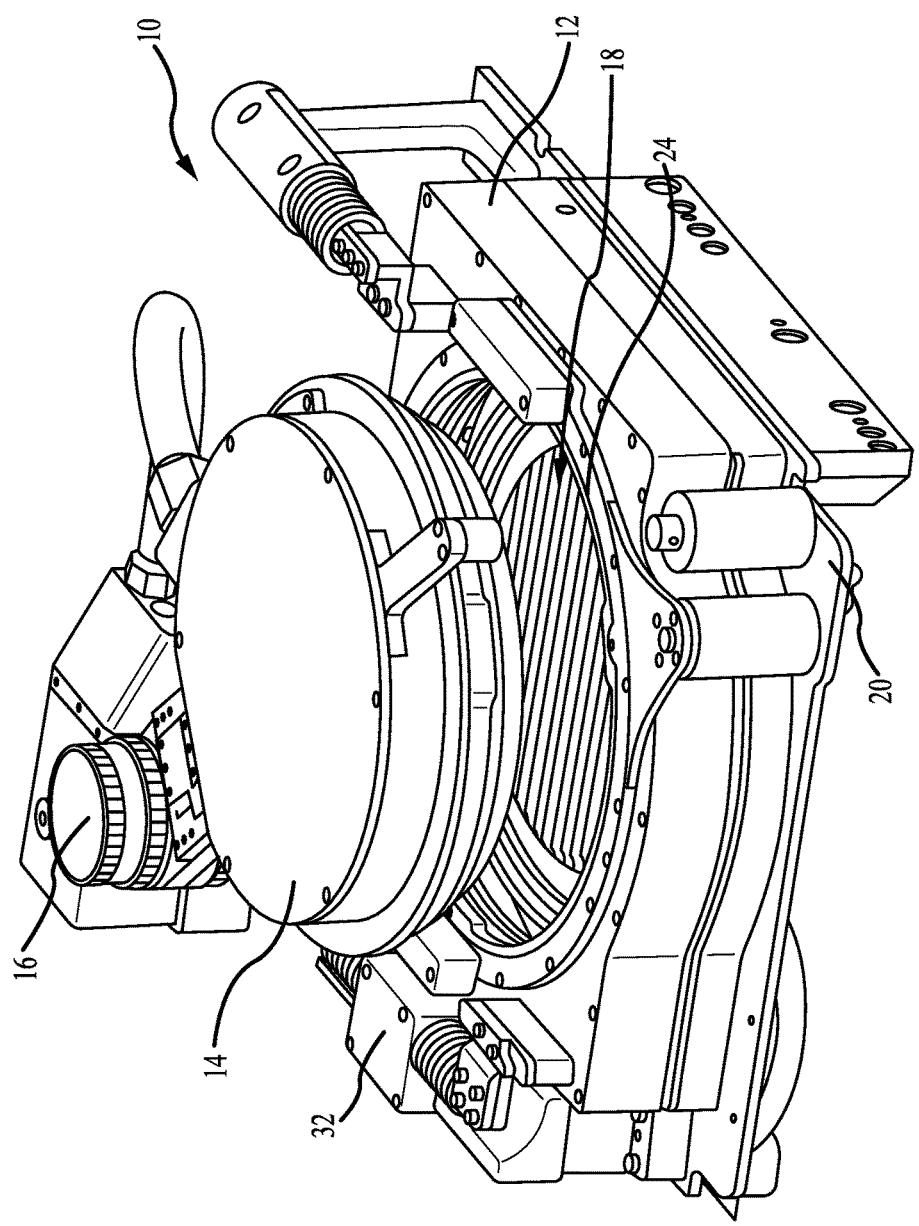
FIG. 1 shows a top perspective view of an exemplary electroplating system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In many or most electroplating applications, it is important that the plated film or layer(s) of metal have a uniform thickness across the wafer or workpiece. Non-uniformities can be caused by irregularities in the electric field due to pattern variations, by mass-transfer rates, and/or other factors. For example, co-planarity issues may arise when a substrate has regions that have different densities of vias or pillars. Oftentimes, areas that are more sparsely populated with the vias and/or pillars exhibit higher plating heights than areas that are more densely populated with the vias and/or pillars. Conventional systems may attempt to improve such co-planarity issues by changing the chemistry of the electroplating operation, change a deposition and/or mass-transfer rate, adjust a conductivity of the electrolyte bath, and/or use multiple chemistries to plate and subsequently de-plate the substrate. However, such operations may introduce additional complexity, time, and/or cost into the electroplating operation and/or may cause other issues in the electroplating process.

The present technology overcomes these challenges by incorporating components that selectively shield various regions of a substrate from the electric field produced during electroplating operations. For example, embodiments of the present technology may utilize a die shield that includes solid shield areas that correspond with and shield sparse regions from the electric field and open areas that enable the electric field to pass through to dense regions of the substrate. The use of such die shields may enable plating heights/rates to be maintained in dense regions, while reducing the plating heights/rates in sparse regions. Some embodiments may utilize a paddle that includes apertures aligned with dense regions that enable the electric field to pass through to the dense regions of the substrate, while a solid face of the paddle may shield sparse regions from the electric field. Some embodiments may improve co-planarity by plating and subsequently de-plating the substrate within a same chemical bath. Accordingly, the present technology may produce improved co-planarity of substrates during electroplating operations.

Although the remaining disclosure will routinely identify specific electroplating processes utilizing the disclosed technology, it will be readily understood that the systems and methods are equally applicable to other plating chambers and systems, as well as processes as may occur in the described systems. Accordingly, the technology should not be considered to be so limited as for use with these specific plating processes or systems alone. The disclosure will discuss one possible system that may include electroplating components according to embodiments of the present technology before additional variations and adjustments to this system according to embodiments of the present technology are described.

Figure 2:
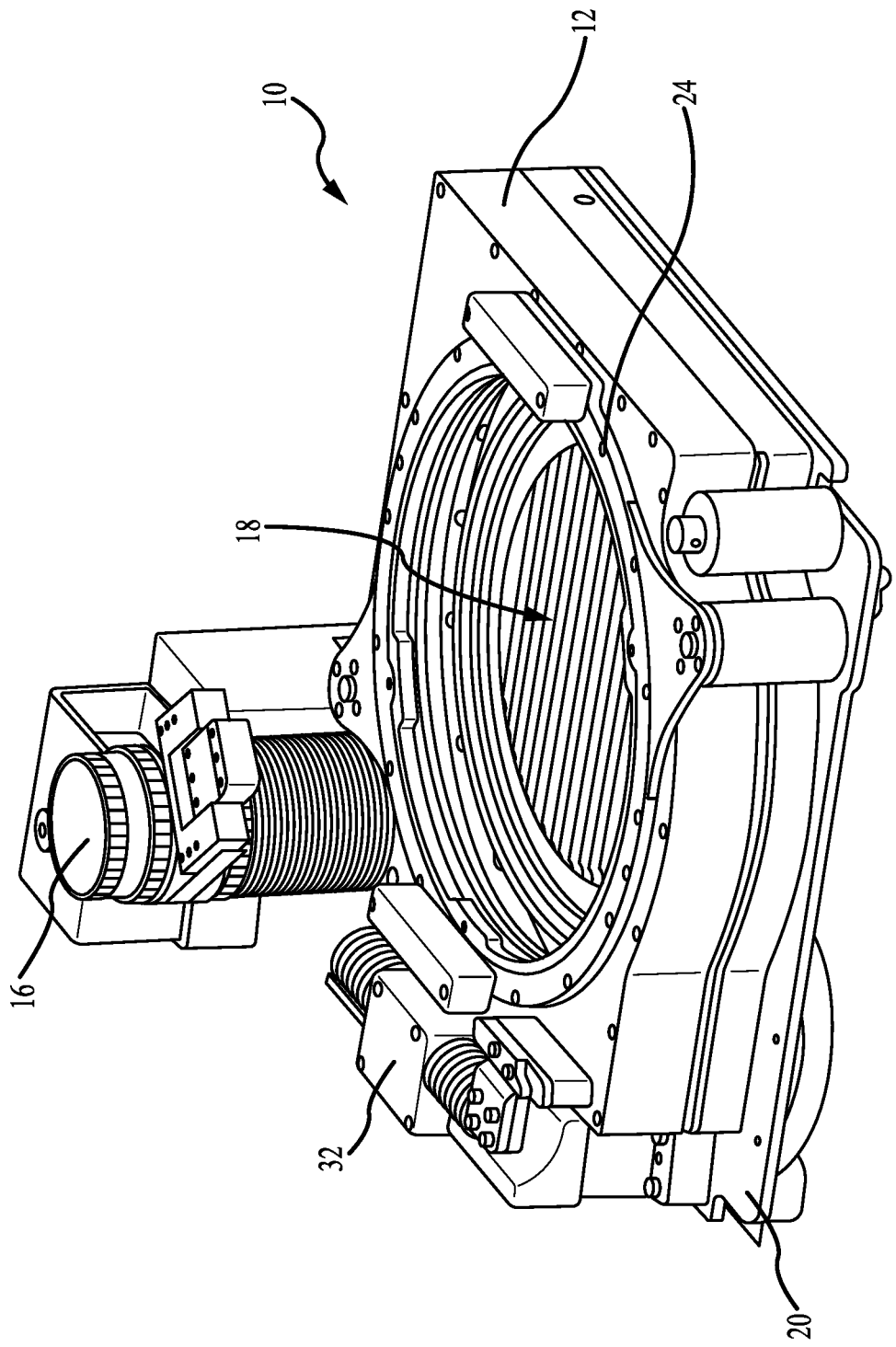
FIG. 2 shows a top perspective view of the system of FIG. 1 with the head removed for purposes of illustration.
Figure 3:
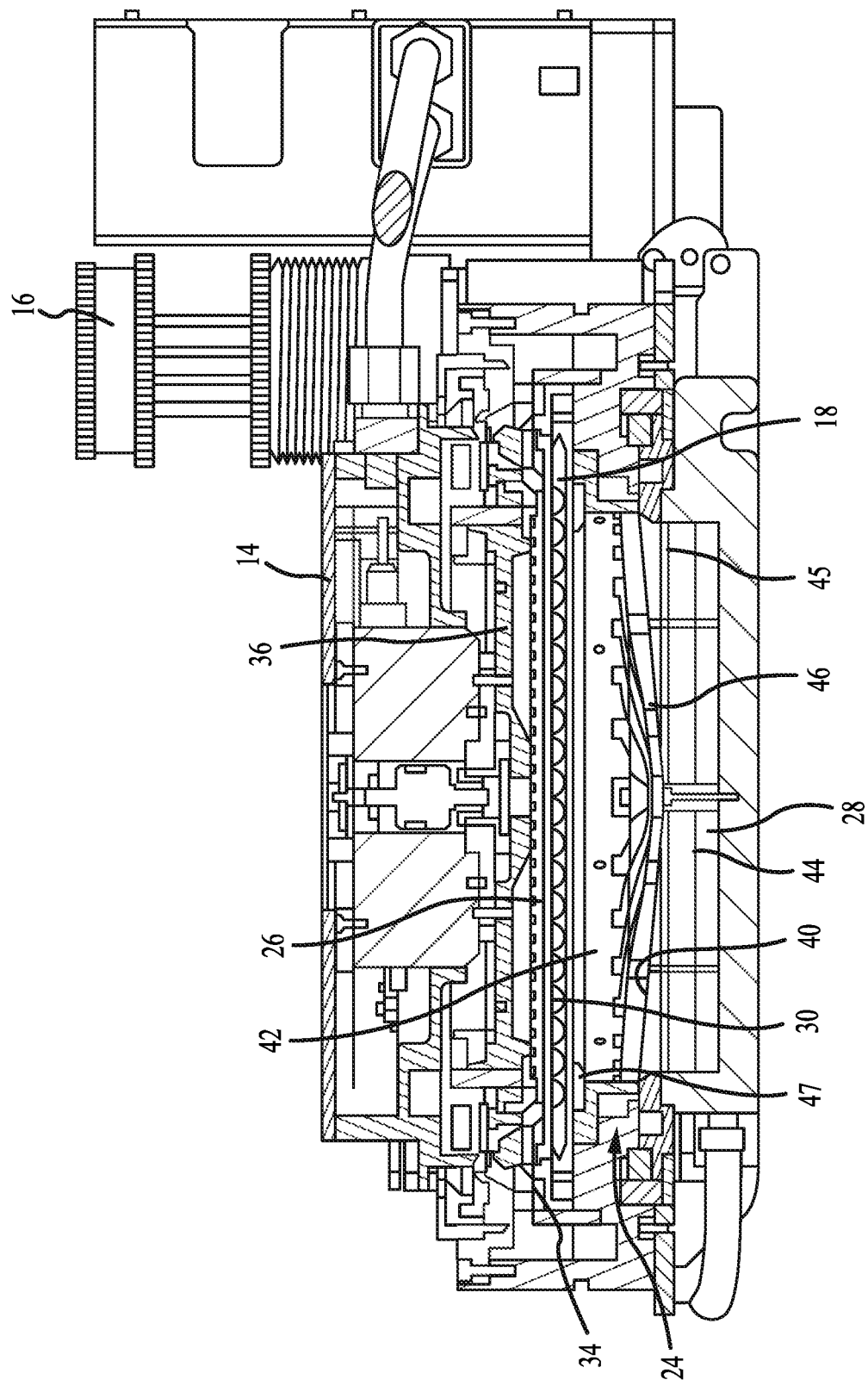
FIG. 3 shows a section view of the system of FIG. 1.

FIGS. 1-3 illustrate an exemplary system 10 for electroplating a substrate 30 according to embodiments of the present technology. System 10 may include a head 14 supported on a head lifter 16 and a vessel 24. A single system 10 may be used as a standalone unit. Alternatively, multiple systems 10 may be provided in arrays within an enclosure, with substrates or workpieces loaded and unloaded into and out of the processors by one or more robots. Head lifter 16 may lift and/or invert the head 14 to load and unload a substrate 300. Head lifter 16 may also lower the head 14 into engagement with one or more components of the vessel 24 for processing of the substrate 300. A membrane 40 may be included to divide the vessel 24 into a lower chamber 44 containing one or more anodes 28, and a first liquid electrolyte, below the membrane 40, and an upper chamber 42 containing a second liquid electrolyte. Alternatively the membrane 40 may be omitted with the vessel 24 having a single chamber holding a single electrolyte. Referring to the section view of FIG. 3, a field shaping element 46 made of a dielectric material may be provided in the vessel 24. Field shaping element 46 may support the membrane 40 and may distribute flow of catholyte. The electric field in the vessel 24 may be shaped via an anode shield 45, a chamber shield 47, and/or a weir shield 34. The weir shield 34 may be provided in the vessel 24 between the paddle 18 and a seal of a contact ring 26. The shields may be annular dielectric elements and may provide shielding of the electric field with the vessel 24.

The contact ring 26 may be disposed on the head 14, which may hold the substrate 30 and may have a plurality of contact fingers for making electrical contact with a conductive layer, such as a metal seed layer, on the substrate 30. The contact ring 26 may optionally have a seal 38 to seal the contact fingers from the electrolyte. The head 14 may include a rotor 36 for rotating the substrate 30 during processing, with the contact ring 26 on the rotor. Typically the contact ring may include a seal and a backing plate, with the contact ring and the backing plate forming a substrate holder. The head 14 may be movable to position the substrate holder into a processing position in the vessel, where the seed layer may be in contact with electrolyte in the vessel. Electrical control and power cables (not shown) may be linked to the lift/rotate weir shield 34 and to internal head components lead up from system 10 to facility connections, or to connections within multi-processor automated system. A rinse assembly 12 having tiered drain rings may be provided above and/or about the vessel 24.

A paddle 18 may be provided at a fixed vertical position within the vessel 24 adjacent to the substrate 30. In some embodiments, the paddle 18 may be a generally circular plate of dielectric material having a plurality of parallel ribs or blades spaced apart by slots and/or other openings. A paddle actuator 32 may move the paddle 18 horizontally in a flat plane, parallel to the substrate 30, within the vessel 24 to agitate the electrolyte. The paddle 18 and the paddle actuator 32 may be supported on a base plate 20 attached to the vessel 24. The substrate 30 may be rotating or stationary. The slots and/or other openings on the paddle 18 may enable allow ionic current to pass through the paddle 18.

In some embodiments, the paddle 18 itself is used as an electric field shield. In typical operation, the paddle 18 may move with an oscillation (which may be between or about 6-10 Hz in some embodiments), and with a stroke that is about ½ to 1× the paddle rib pitch. A secondary low frequency oscillation may be used to shift the rib reversal points to avoid imprinting either an electric field or mass transfer signature on the substrate 30 (i.e., stripes on a stationary substrate, and rings on a rotating substrate). This secondary oscillation is referred to as the stagger motion. The stagger motion envelope may be roughly equal to the rib pitch. During processing, the paddle actuator 56 moves the paddle 54 to agitate the catholyte contained in the vessel 24. For example, the paddle 18 may move back and forth within a paddle travel dimension, with an oscillating motion. For some applications the paddle 18 may use other movements, such as start/stop, stagger, etc.

Figure 4:
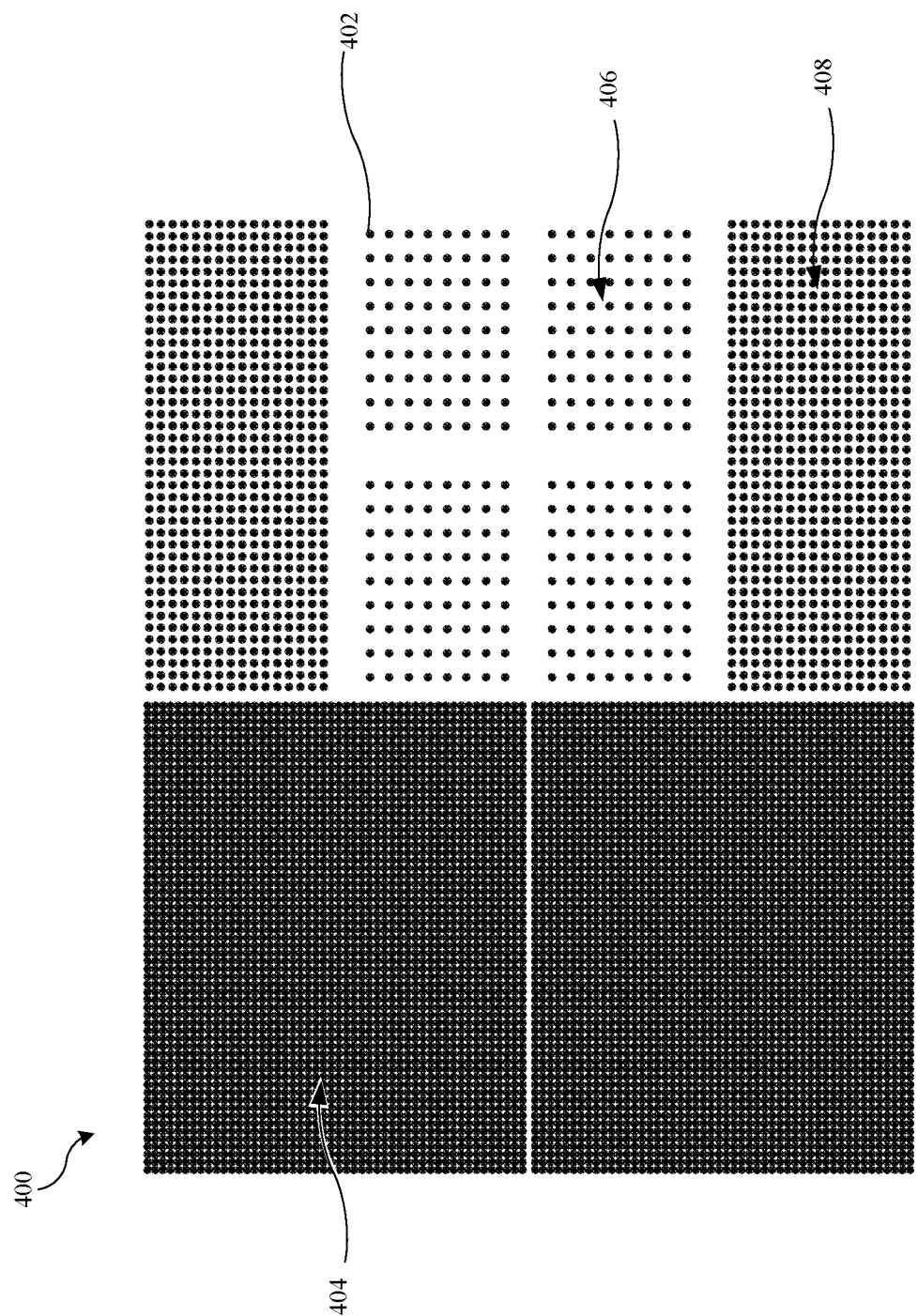
FIG. 4 shows a schematic top plan view of a die pattern according to some embodiments of the present technology.

FIG. 4 illustrates a schematic top plan view of an exemplary substrate 400. Substrate 400 may include a number of vias or pillars 402, such as copper pillars, that may be formed using an electroplating operation. In some embodiments, the pillars 402 may be arranged about the substrate 400 such that different regions of the substrate 400 have different densities of pillars 402. For example, the substrate 400 may include one or more dense regions 404, which may include a high density of pillars 402 and/or sparse regions 406 that may include a low density of pillars 402. Some embodiments may include additional regions 408 of intermediate densities, and it will be appreciated that any number of regions with any number of different densities may be provided on a given substrate 400. The densities may be characterized by a number of pillars present within an area of the substrate 400, based on a pitch (or distance) between centers of adjacent pillars 402 within a given region, and/or based on an open area (e.g., percentage of a region that is occupied by vias/pillars 402) within a given region. The regions may be the same size and/or may be different sizes. The terms "high", "intermediate", and "sparse" are understood to be relative terms based on the pillar arrangement for a given substrate 400. For example, a region having a pitch between adjacent pillars 402 of 225 µm may be considered dense for one substrate that also includes a region having a pitch between adjacent pillars 402 of 375 µm, while such a region may be sparse for a substrate that also includes a region having a pitch between adjacent pillars 402 of 150 µm. During electroplating operations, different regions of the substrate 400 may have greater deposition heights than other regions. For example, dense regions 404 may have lower deposition heights than intermediate regions 408 and/or sparse regions 406.

Figure 5:
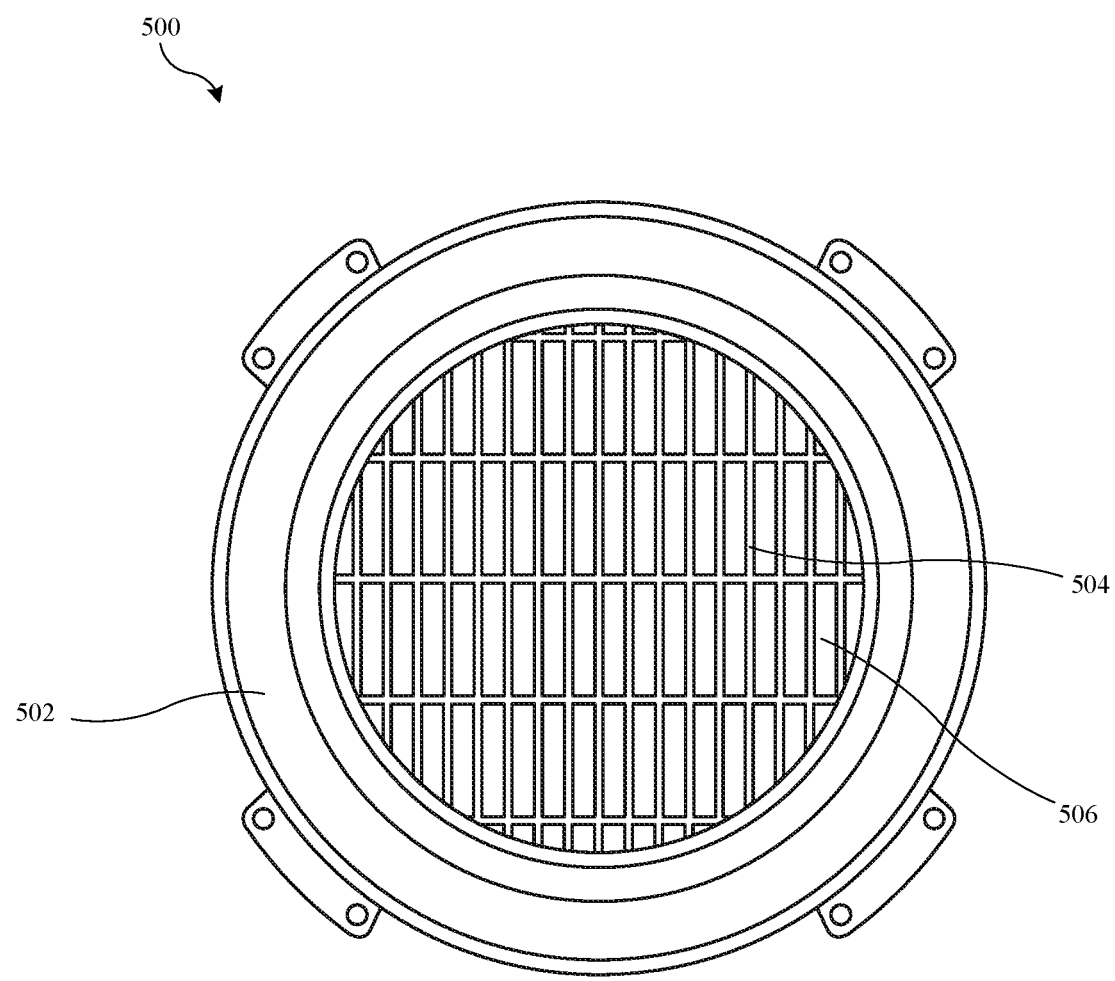
FIG. 5 shows a schematic top plan view of an exemplary die shield according to some embodiments of the present technology.

In some embodiments, additional components may be integrated into an electroplating system to improve the co-planarity of the plated substrate. For example, some electroplating systems such as, but not limited to, system 10 may include a die shield that selectively shields portions of the substrate from the electric field produced by the anodes during the plating operation to reduce electrodeposition heights at selected regions of the substrate, such as the sparse regions 406 illustrated in FIG. 4 above, while enabling the electrodeposition heights at other regions, such as the dense regions 404, to remain unchanged. This may help improve the co-planarity across the substrate. FIG. 5 illustrates a schematic top plan view of an exemplary die shield 500 according to some embodiments of the present technology. FIG. 5 may illustrate further details relating to components in system 10, such as for weir shield 34. Die shield 500 may be positioned within a vessel, similar to vessel 24. For example, the die shield 500 may be positioned between the substrate and the anodes of the vessel. In some embodiments, the die shield 500 may be coupled with and/or otherwise supported by a weir shield 502, which may be similar to weir shield 34 described above in conjunction with FIGS. 1-3. For example, the die shield 500 may span a central opening formed in the weir shield 34, which may position the die shield close proximity with the substrate. A distance between die shield 500 and the top edge of the paddle (such as a top surface of the ribs of paddle 18) may be between or about 0.5 mm and 4 mm, between or about 1 mm and 3 mm, or between or about 1.5 mm and 2 mm. A distance between the die shield 500 and the substrate (such as substrate 30) may be between or about 1 mm and 6 mm, between or about 2 mm and 5 mm, or between or about 3 mm and 4 mm, with shorter distances providing greater tuning precision for shielding the electric field.

Die shield 500 may be characterized by a number of shield areas 504 and a number of open areas 506. In some embodiments, the shield areas 504 may all be connected by support segments that pass through the open areas 506. The support segments may be as thin as possible to minimize shielding effects of the support segments while remaining sufficiently thick so as to help maintain sufficient rigidity of the die shield 500 to resist damage or deformation when submerged in the agitated electrolyte. The thickness may depend on the material used to fabricate the die shield 500. To further ensure that the die shield 500 is sufficiently strong to resist damage or deformation during electroplating operations, the die shield 500 may have a thickness of between or about 0.5 mm and 5 mm, between or about 1 mm and 4 mm, or between or about 2 mm and 3 mm. The die shield 500 may be formed from any material that is chemically compatible with the electroplating solution. In some embodiments, the die shield 500 may be formed from polymers, such as acrylonitrile butadiene styrene (ABS), polyethylene terephthalate glycol (PETG), thermoplastic polyolefin (TPO), and/or thermoplastic or other polymers.

The die shield 500 may be designed to be used when plating a particular die pattern. For example, the shield areas 504 may be arranged to be in alignment with and/or otherwise correspond to sparse regions of a given die pattern, while the open areas 506 may be arranged to be in alignment with and/or otherwise correspond to dense regions of a given die pattern. In some embodiments, each shield area 504 may substantially match (e.g., has an area within or about 20%, within or about 15%, within or about 10%, within or about 5%, within or about 3%, within or about 1%, or less) a size and/or shape of a respective sparse region of a die pattern and/or each open area 506 may substantially match a size and/or shape of a respective sparse region of a die pattern. In other embodiments, the dimensions of the shield areas 504 may be less than or greater than dimensions of a corresponding sparse region of a die pattern. For example, the difference in dimensions may be at least or about 5%, at least or about 10%, at least or about 15%, at least or about 20%, at least or about 25%, or more. Similarly, the dimensions of the open areas 506 may be less than or greater than dimensions of a corresponding dense region of a die pattern. For example, the difference in dimensions may be at least or about 5%, at least or about 10%, at least or about 15%, at least or about 20%, at least or about 25%, or more. Such a design may account for any lateral spreading of the electric field after passing through the die shield. The sizing of the shield areas 504 and/or open areas 506 may be determined be best account for any expected and/or tested deposition height differences, and in some cases may account for gradual transitions of deposition height between different regions of a die pattern.

While illustrated with the shield areas 504 and open areas 506 arranged in a symmetric repeating pattern, it will be appreciated that the arrangement of the shield areas 504 and/or open areas 506 may be driven by a particular die pattern and may be a non-repeating and/or asymmetric arrangement. Additionally, the shield areas 504 and/or open areas 506 may have generally rectangular shapes as shown here, or may have other shapes. The use of non-rectangular shapes may be particularly useful in accounting for deposition height differences within a single region of a die pattern. For example, a die pattern with rectangular sparse and dense regions may exhibit slightly different deposition heights near edges and/or corners of the rectangular regions, while central portions of each region may have fairly consistent deposition heights. The shape of the shield areas 504 and/or open areas 506 may be adjusted to account for such non-uniformity in some embodiments.

By utilizing a die shield with solid shield areas that correspond with and shield sparse regions from the electric field and open areas that enable the electric field to pass through to dense regions of the substrate, embodiments may enable plating heights/rates to be maintained in dense regions, while reducing the plating heights/rates in sparse regions. Such die plates may be used to improve co-planarity of substrates during electroplating operations.

Figure 6:
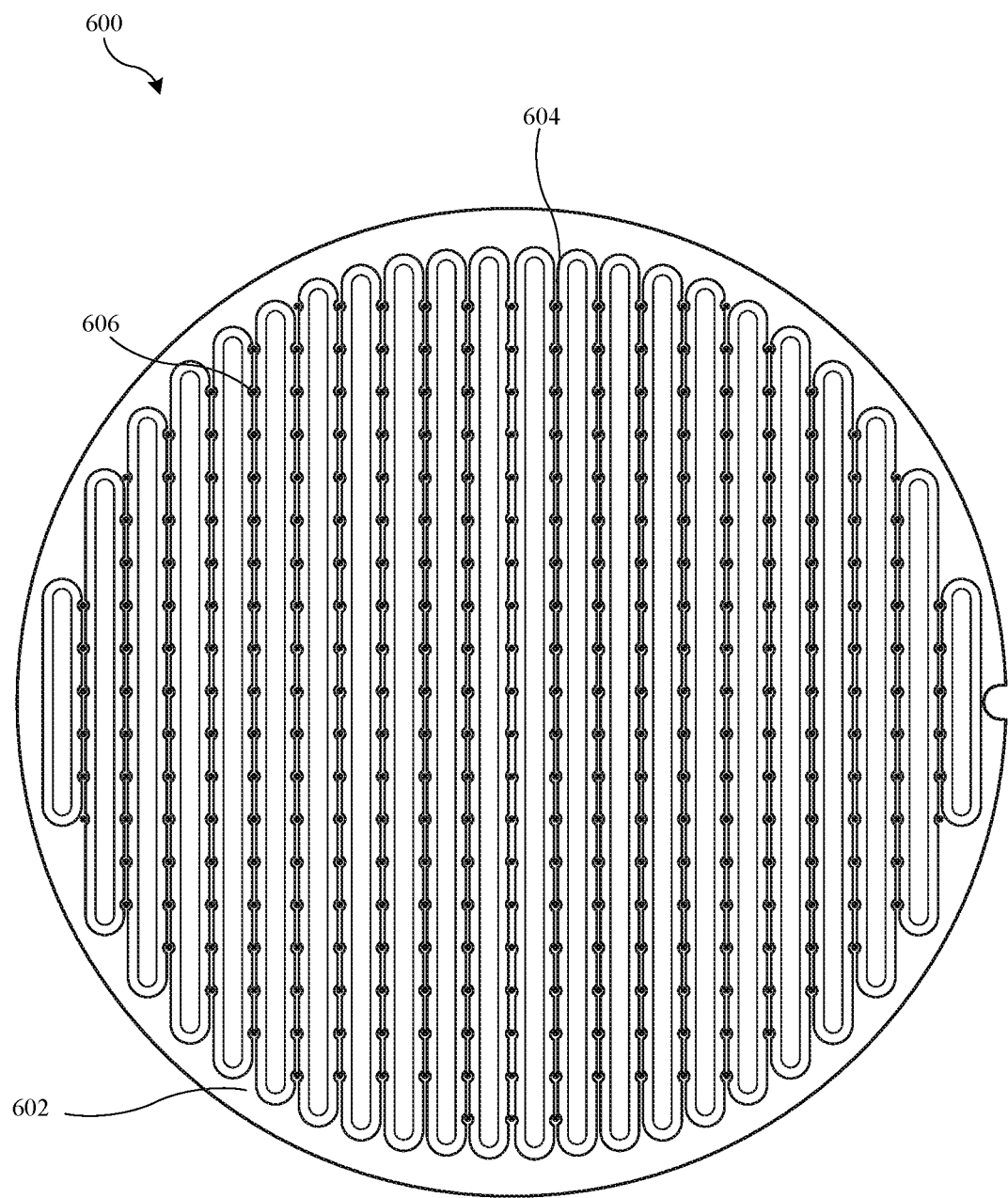
FIG. 6 shows a schematic top plan view of an exemplary paddle according to some embodiments of the present technology.

As previously discussed, some embodiments of the present technology may utilize a paddle to provide some electric shielding within an electroplating system. Such use of the paddle as an electric field shielding device may be used in conjunction with, or separate from the use of a die shield. FIG. 6 illustrates a schematic top plan view of an exemplary paddle 600 according to some embodiments of the present technology. FIG. 6 may illustrate further details relating to components in system 10, such as for paddle 18. Paddle 600 may be positioned within a vessel, similar to vessel 24. Oftentimes, a distance between the paddle 600 and the substrate may be between or about 3 mm and 10 mm, between or about 4 mm and 9 mm, between or about 5 mm and 8 mm, or between or about 5.5 mm and 7 mm, with shorter distances providing more effective shielding and improvement precision and tunability of electric field shielding. Paddle 600 may be characterized by a first surface 602 and a second surface (not shown) opposite the first surface 602. The first surface 602 may face the substrate within the electroplating vessel. The first surface 602 may include a number of ribs 604 that extend upward from the first surface 602. For example, the ribs 604 may be parallel to each other, and may be equally spaced apart in an array. The distance between adjacent ribs 604 (or pitch) may be between or about 10 mm and 20 mm, between or about 11 mm and 19 mm, between or about 12 mm and 18 mm, between or about 13 mm and 17 mm, between or about 14 mm and 16 mm, or about 15 mm. In some embodiments, the rib pitch may be determined by a given die pattern. For example, the ribs 604 may be arranged to match (or substantially match) a characteristic length associated with the die pattern, such as a distance between repeating dense regions, etc. A height of each rib may be between or about 5 mm and 15 mm, between or about 6 mm and 14 mm, between or about 7 mm and 13 mm, between or about 8 mm and 12 mm, between or about 9 mm and 11 mm, or about 10 mm. In some embodiments, ends of some or all of the ribs 604 may be open, such that all of the ribs 604 are formed from distinct structures, to facilitate drainage. In other embodiments, the ends of some or all of the ribs 604 may bend around such that all of the ribs 604 are formed from a single winding structure. In such embodiments, some or all of the ends may define drainage apertures (not shown). In some embodiments, slots and/or other openings (such as those described in relation to paddle 18) may be included in paddle 600, which may increase the current flow conductance through the paddle 600. The paddle 600 may be a round and generally flat dielectric material, with a total thickness of between or about 7-40 mm. The paddle 600 may be generally symmetrical about a centerline parallel to the ribs 604. In some embodiments, the second surface of the paddle 600 may be flat, while in other embodiments the second surface may generally mirror the first surface 602 and may include a number of ribs.

Figure 6A:
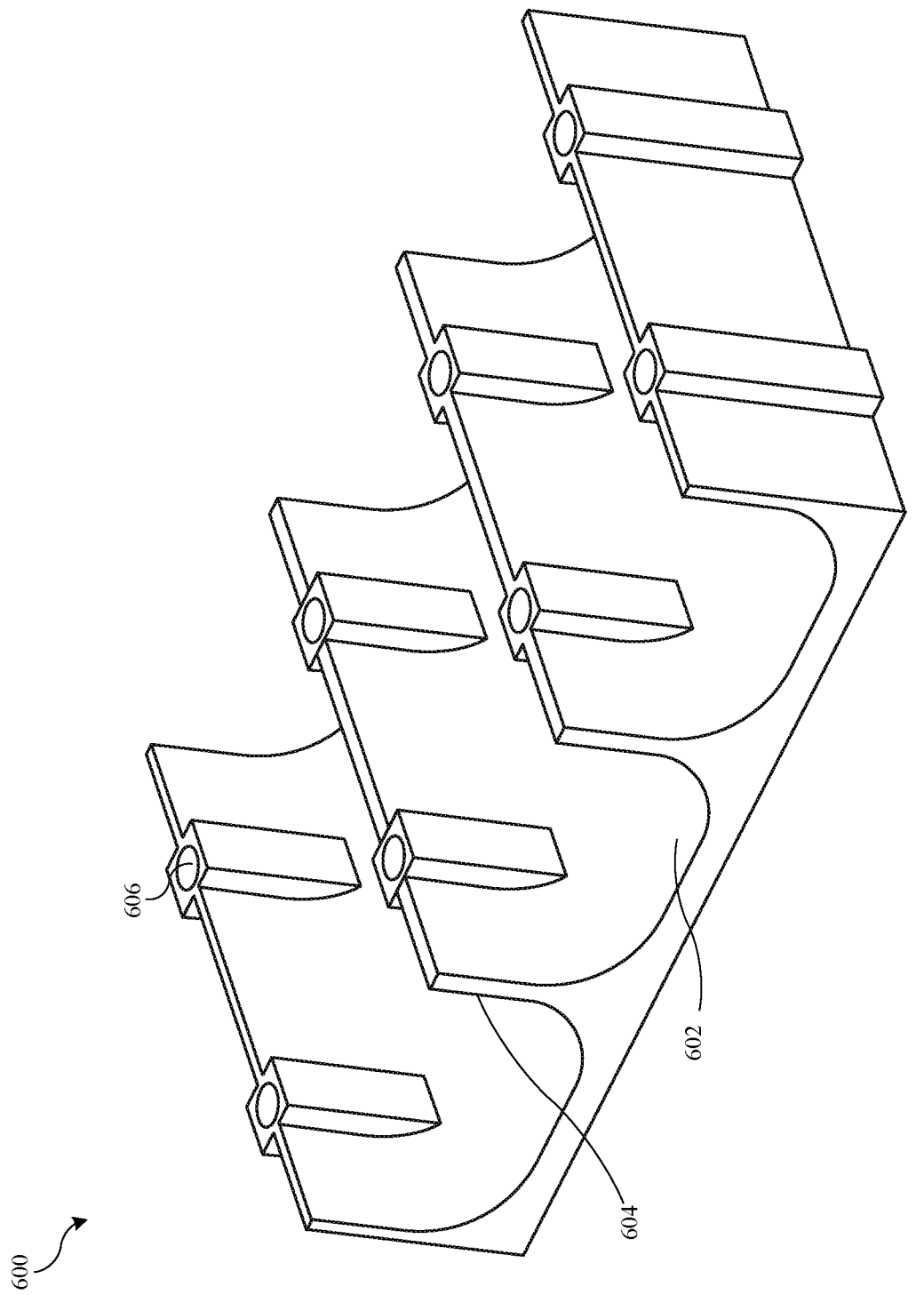
FIG. 6A shows a section view of the paddle of FIG. 6.

As best illustrated in FIG. 6A, the paddle 600 may define a plurality of apertures 606 that extend through a thickness of the paddle 600 such that each aperture 606 is generally vertical when the paddle 600 is positioned within an electroplating vessel. For example, each aperture 606 may extend from the second surface (which may be a flat portion of the second surface or may be a distal end of a rib protruding from the second surface) through a top surface of a respective one of the ribs 604. In such embodiments, each rib 604 may include a number of apertures 606 positioned along a length of the rib 604. In some embodiments, a thickness of each rib 604 may be sufficient to accommodate the diameter of the apertures 606. In other embodiments, such as illustrated here, areas of each rib 604 proximate an aperture 606 may have an increased local thickness to accommodate the aperture diameter. While shown with the increased local thickness being provided as rectangular prism shapes protruding upward along a height of the rib 604, it will be appreciated that other shapes may be utilized. For example, cylindrical shapes and/or other shapes with tapered sidewalls may be utilized to provide the increased local thickness. In some embodiments, slots and/or other openings (such as those described in relation to paddle 18) may be included in paddle 600, which may increase the current flow conductance through the paddle 600.

Oftentimes, the apertures 606 may include a circular cross-section, although other cross-sectional shapes are possible in various embodiments. Each of the apertures 606 may have a diameter (or other width dimension) that is less than about 10 mm. For example, the diameter may be between or about 0.5 mm and 10 mm, between or about 1 mm and 9 mm, between or about 2 mm and 8 mm, between or about 3 mm and 7 mm, between or about 4 mm and 6 mm, or about 5 mm. In some embodiments, each aperture 606 may have the same diameter, while in other embodiments some or all of the apertures 606 may have different dimensions. The apertures 606 may be spaced apart along a length of each rib 604 at regular and/or irregular intervals. In some embodiments, the distance between adjacent apertures 606 (e.g., aperture pitch) on a given rib 604 may be between or about 10 mm and 20 mm, between or about 11 mm and 19 mm, between or about 12 mm and 18 mm, between or about 13 mm and 17 mm, between or about 14 mm and 16 mm, or about 15 mm. The distance may be measured from centers of adjacent apertures 606. In some embodiments, the distance between apertures 606 along a length of the rib 604 may be the same as the distance between apertures 606 on adjacent ribs 604 (i.e., the pitch of the ribs 604), while in other embodiments these distances may be different. In some embodiments, the aperture pitch may be determined by a given die pattern. For example, the aperture pitch may be arranged to match a characteristic length associated with the die pattern, such as a distance between repeating dense regions, etc. Based on the number, size, and spacing of apertures 606, the paddle 600 may have a total open area through which the electric field may pass of less than or about 30%, less than or about 25%, less than or about 20%, less than or about 15%, less than or about 10%, less than or about 5%, less than or about 3%, less than or about 2%, less than or about 1.5%, less than or about 1%, less than or about 0.5% or less, with paddles with lower percentages of open areas providing greater shielding from the electric field.

As indicated above, the arrangement, number, and/or size of the apertures 606 on the paddle 600 may be designed based on a given die pattern. For example, each aperture 606 may be aligned with a portion of a given dense region of a die pattern, while sparse regions are aligned with solid portions of the paddle 600. A number of apertures 606 aligned with a given dense region may depend on the size and shape of a dense region. Each dense region may be aligned with at least or about 1 aperture, at least or about 2 apertures, at least or about 3 apertures, at least or about 4 apertures, or more. In some embodiments, one or more of the apertures 606 may be centered along a length of a dense region. Apertures 606 may be offset from a center of the dense region in some embodiments. For example, apertures 606 may be aligned such that during agitation of the paddle 600, the apertures 606 translate relative to the dense region to provide substantially uniform coverage over the entire dense region.

Figure 7:
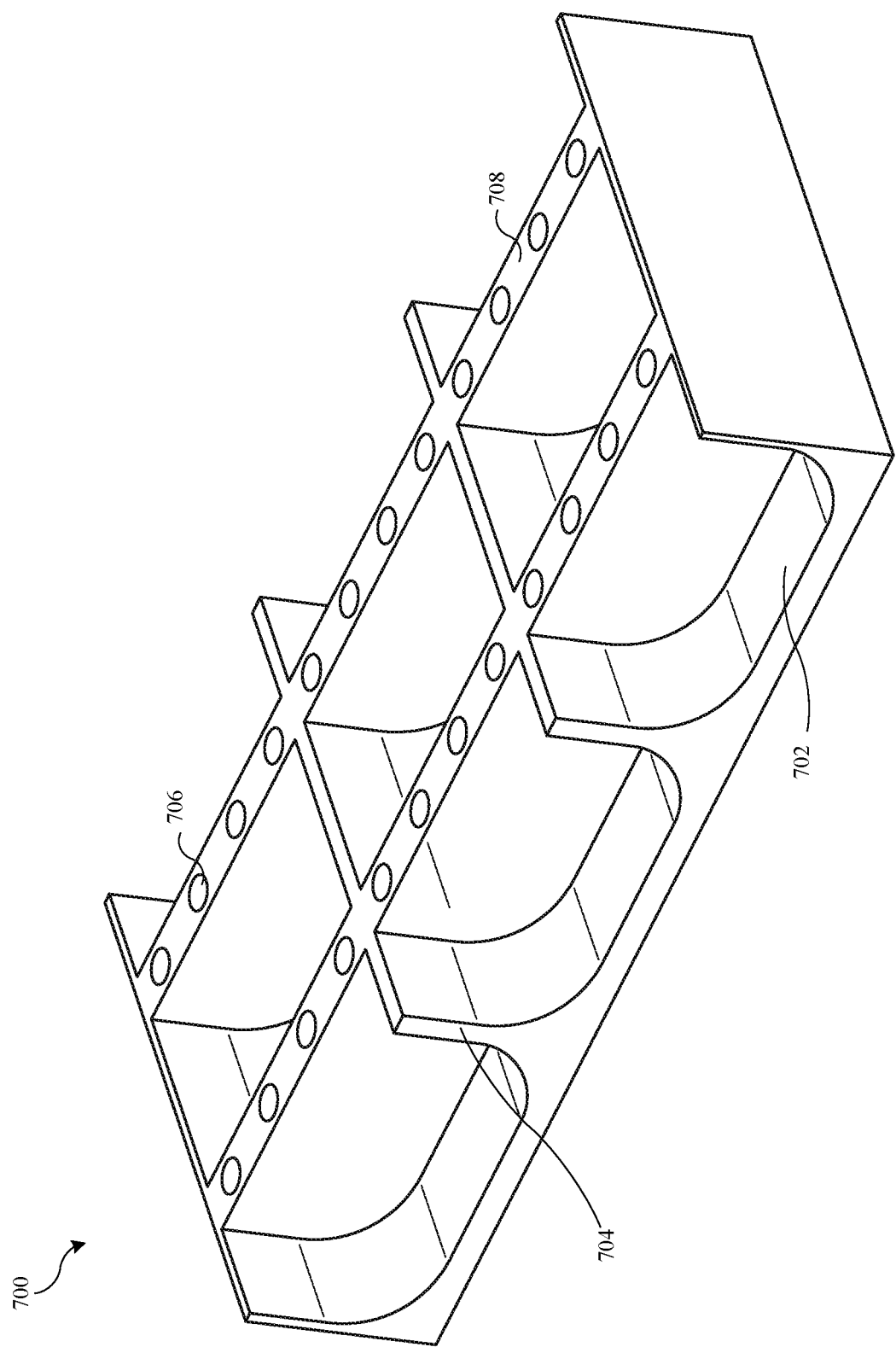
FIG. 7 shows a section view of an exemplary paddle according to some embodiments of the present technology.

FIG. 7 is a partial cross-sectional top isometric view of an exemplary paddle 700 according to some embodiments of the present technology. FIG. 7 may illustrate further details relating to components in system 10, such as for paddle 18. Paddle 700 may include similar features as paddle 600. For example, paddle 700 may be characterized by a first surface 702 and a second surface, with one or both of the first surface 702 and the second surface including a number of ribs 704. Paddle 700 may include a number of vertical dividers 708 that extend transversely between adjacent ribs 704. The vertical dividers 708 may each have a thickness of between or about 1.5 mm and 12 mm, between or about 2 mm and 11 mm, between or about 3 mm and 10 mm, between or about 4 mm and 9 mm, between or about 5 mm and 8 mm, or between or about 6 mm and 7 mm. A pitch between adjacent vertical dividers 708 may be between or about 10 mm and 20 mm, between or about 11 mm and 19 mm, between or about 12 mm and 18 mm, between or about 13 mm and 17 mm, between or about 14 mm and 16 mm, or about 15 mm.

Paddle 700 may define a number of apertures 706 that extend through a thickness of the paddle. Apertures 706 may extend from the second surface through a top surface of a respective one of the vertical dividers 708. In some embodiments, each aperture 706 may be centered within a width of a vertical divider 708, although in other embodiments one or more of the apertures 706 may be offset from a midpoint of the width of the vertical divider 708. Some or all of the apertures 706 may be in alignment with one of the ribs 704 and/or may be offset from the ribs 704 (as shown here). In some embodiments, each vertical divider 708 may define at least one drainage aperture that extends through a thickness of the vertical divider 708. The drainage apertures may be positioned in between adjacent apertures 706. In some embodiments, slots and/or other openings (such as those described in relation to paddle 18) may be included in paddle 700, which may increase the current flow conductance through the paddle 700.

Oftentimes, the apertures 706 may include a circular cross-section, although other cross-sectional shapes are possible in various embodiments. Each of the apertures 706 may have a diameter (or other width dimension) that is between or about 0.5 mm and 10 mm, between or about 1 mm and 9 mm, between or about 2 mm and 8 mm, between or about 3 mm and 7 mm, between or about 4 mm and 6 mm, or about 5 mm. In some embodiments, each aperture 706 may have the same diameter, while in other embodiments some or all of the apertures 706 may have different dimensions. The apertures 706 may be spaced apart along a length of each vertical divider 708 at regular and/or irregular intervals. In some embodiments, the distance between adjacent apertures 706 on a given vertical divider 708 may be between or about 3 mm and 20 mm, between or about 4 mm and 18 mm, between or about 5 mm and 16 mm, between or about 6 mm and 14 mm, between or about 7 mm and 12 mm, or between or about 8 mm and 10 mm. The distance may be measured from centers of adjacent apertures 706. In some embodiments, the distance between apertures 706 along a length of the vertical divider 708 may be less than the distance between apertures 706 on adjacent vertical dividers 708 (i.e., the pitch of the vertical dividers 708), while in other embodiments these distances may be the same. In some embodiments, the aperture pitch may be determined by a given die pattern. For example, the aperture pitch may be arranged to match a characteristic length associated with the die pattern, such as a distance between repeating dense regions, etc. Based on the number, size, and spacing of apertures 606, the paddle 600 may have a total open area through which the electric field may pass of less than or about 30%, less than or about 25%, less than or about 20%, less than or about 15%, less than or about 10%, less than or about 5%, less than or about 3%, less than or about 2%, less than or about 1.5%, less than or about 1%, less than or about 0.5% or less, with paddles with lower percentages of open areas providing greater shielding from the electric field.

As indicated above, the arrangement, number, and/or size of the apertures 706 on the paddle 700 may be designed based on a given die pattern. For example, each aperture 706 may be aligned with a portion of a given dense region of a die pattern, while sparse regions are aligned with solid portions of the paddle 700. A number of apertures 706 aligned with a given dense region may depend on the size and shape of a dense region. Each dense region may be aligned with at least or about 1 aperture, at least or about 2 apertures, at least or about 3 apertures, at least or about 4 apertures, or more. In some embodiments, one or more of the apertures 706 may be centered along a length of a dense region. Apertures 706 may be offset from a center of the dense region in some embodiments. For example, apertures 706 may be aligned such that during agitation of the paddle 700, the apertures 706 translate relative to the dense region to provide substantially uniform coverage over the entire dense region.

By utilizing a paddle that selectively shields sparse regions from the electric field and apertures that enable the electric field to pass through to dense regions of the substrate, embodiments may enable plating heights/rates to be maintained in dense regions, while reducing the plating heights/rates in sparse regions. Additionally, the translation of the paddle within the vessel may help further improve the non-uniformity of plating on substrates. Therefore, such paddles may be used to improve co-planarity of substrates during electroplating operations.

Figure 8:
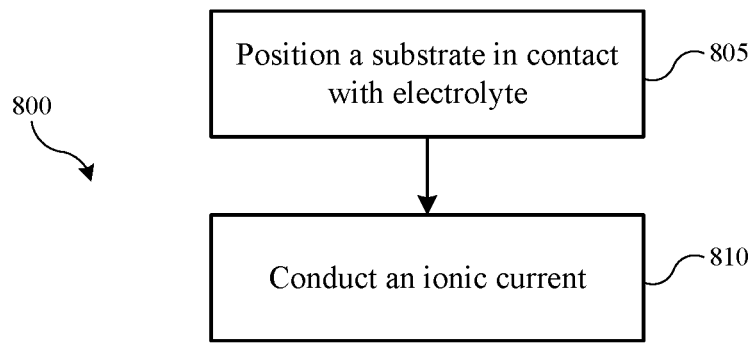
FIG. 8 shows operations of an exemplary method of electroplating a substrate according to some embodiments of the present technology.

FIG. 8 shows operations of an exemplary method 800 of electroplating a substrate according to some embodiments of the present technology. The method may be performed in a variety of electroplating systems, including system 10 described above, which may include die shields (such as die shield 500) and/or paddles (such as paddles 600 and 700) according to embodiments of the present technology, such as any die shield and/or paddle discussed previously. Method 800 may include a number of optional operations, which may or may not be specifically associated with some embodiments of methods according to the present technology.

Method 800 may include a processing method that may include operations for electroplating a substrate, such as a semiconductor substrate. The method may include optional operations prior to initiation of method 800. For example, in some instances a portion of an electroplating operation may be performed without a die shield (in the same and/or different vessel), with the operation being completed in a vessel having a die shield. The method may include additional operations. For example, method 800 may include operations performed in different orders than illustrated. Method 800 may include positioning a substrate into contact with liquid electrolyte within a vessel at operation 805. For example, the substrate may be positioned within a head and lowered into the electrolyte. The vessel may include a die shield (such as die shield 500), which may be positioned between the substrate and one or more anodes of the electroplating system. The die shield may be designed for a particular die pattern. For example, the die shield may define a number of open areas and one or more shield areas, with the open areas being aligned with and/or otherwise corresponding with dense regions of the die pattern and the shield areas being aligned with and/or otherwise corresponding with sparse areas of the die shield.

In some embodiments, method 800 may include producing and/or selecting a die shield for use in electroplating a substrate with a given die pattern (e.g., arrangement of vias and/or pillars). For example, a die pattern may be provided and analyzed to identify features of the die pattern. For example, sizes, shapes, locations, densities, and/or other characteristics of the die pattern may be identified. Based on the die pattern information, a die shield design may be generated. For example, based on the sizes, shapes, locations, densities, and/or other characteristics of the die pattern, an electroplating deposition height profile may be modeled. Based on the modeled height profile, additional computer modeling may be used to size, shape, and position a number of shield areas and open areas for the die shield design to even out the predicted deposition heights across the substrate. Once designed, the die shield may be fabricated. For example, the die shield may be 3D printed, molded, machined, and/or otherwise manufactured. In some embodiments, the modeling may have sufficient data to generate an effective die shield design in a single design operation. In other embodiments, the fabricated die shield may be used in a number of test electroplating operations to determine how effective the die shield design is at improving the co-planarity across a substrate. A number of iterative steps involving designing, fabricating, testing, and refining the die shield may be performed to design the final die shield used in electroplating operations.

At operation 810, ionic current may be conducted through the electrolyte liquid. A paddle of the electroplating system may be translated horizontally within the vessel to agitate the liquid while the ionic current is being conducted. The paddle may be similar to paddle 600 or 700, or may be any other paddle known in the art. In some embodiments, method 800 may include rotating the substrate while the ionic current is being conducted through the electrolyte. The substrate may be rotated clockwise and/or counterclockwise by any amount, such as 45 degrees, 90 degrees, 120 degrees, 150 degrees, 180 degrees, etc. Such rotation may be used to align the open areas and shield areas with different portions of the substrate, which may enable the rotation of the substrate during a duty cycle to be utilized as a tuning knob to improve co-planarity across the substrate.

In some embodiments, the substrate may be de-plated within the same chemistry within the vessel. For example, the waveform of the current may be reversed after a portion of the duty cycle to de-plate high regions (such as sparse regions) of the substrate. In some embodiments, this may be done with the substrate in the same orientation relative to the die shield. In other embodiments, the de-plating process may involve adjusting the orientation of the substrate relative to the die shield before and/or during the de-plating current is applied. For example, the substrate may be in a first orientation relative to the die shield (such as with the shield areas aligned with the sparse regions) for a predetermined portion of a duty cycle (e.g., between or about 50% and 99% of the duty cycle, between or about 60% and 90% of the duty cycle, or between or about 70% and 80% of the duty cycle). The orientation may be adjusted to a second orientation (such as with the shield areas aligned with the dense regions) and the remainder of the duty cycle may be completed. This may enable the sparse regions to be de-plated to lower the deposition height at such regions of the substrate, which may help improve the co-planarity across the substrate. In some embodiments, the plating current waveform and/or de-plating current waveform may be synchronized with the translation of the paddle and/or any angular motion (e.g., rotation) of the substrate during the respective process. The plating current density may be the same and/or different than the de-plating current density. For example, in some embodiments, the de-plating current density may be higher or lower than the plating current density.

By utilizing a die shield with solid shield areas that correspond with and shield sparse regions from the electric field and open areas that enable the electric field to pass through to dense regions of the substrate, embodiments may enable plating heights/rates to be maintained in dense regions, while reducing the plating heights/rates in sparse regions. Such die plates may be used to improve co-planarity of substrates during electroplating operations.

Figure 9:
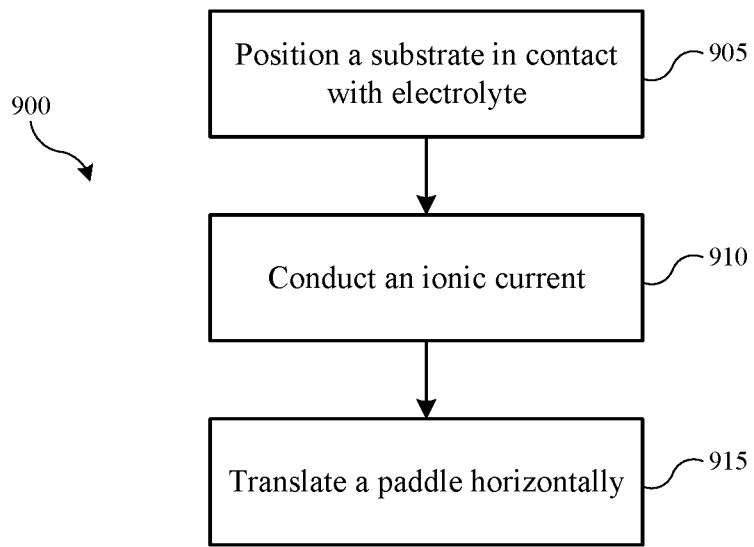
FIG. 9 shows operations of an exemplary method of electroplating a substrate according to some embodiments of the present technology.

FIG. 9 shows operations of an exemplary method 900 of electroplating a substrate according to some embodiments of the present technology. The method may be performed in a variety of electroplating systems, including system 10 described above, which may include die shields (such as die shield 500) and/or paddles (such as paddles 600 and 700) according to embodiments of the present technology, such as any die shield and/or paddle discussed previously. Method 900 may include a number of optional operations, which may or may not be specifically associated with some embodiments of methods according to the present technology. Various operations of methods 800 and 900 may be performed in combination.

Method 900 may include a processing method that may include operations for electroplating a substrate, such as a semiconductor substrate. The method may include optional operations prior to initiation of method 900, or the method may include additional operations. For example, method 900 may include operations performed in different orders than illustrated. Method 900 may include positioning a substrate into contact with liquid electrolyte within a vessel at operation 905. For example, the substrate may be positioned within a head and lowered into the electrolyte. At operation 910, ionic current may be conducted through the electrolyte liquid. A paddle (such as paddle 600 or 700) of the electroplating system may be translated horizontally within the vessel to agitate the liquid while the ionic current is being conducted at operation 915. The paddle may selectively shield a portion of the substrate from the electric field during the electroplating process. The paddle may be characterized by a first surface and a second surface, with the first surface and/or second surface including a plurality of ribs that extend upward from the first surface. The ribs may be arranged in a generally parallel manner about the first surface. The paddle may define a plurality of apertures through a thickness of the paddle. Each of the plurality of apertures may have a diameter of less than about 5 mm, and the paddle may have an open area of less than about 15%. In some embodiments, the apertures may extend along a height of the ribs, such as shown in paddle 600, while in other embodiments the apertures may extend through vertical dividers that extend transversely between the ribs, such as shown in paddle 700.

In some embodiments, the method 900 may include rotating the substrate while the ionic current is being conducted through the electrolyte. The substrate may be rotated clockwise and/or counterclockwise by any amount, such as 45 degrees, 90 degrees, 120 degrees, 150 degrees, 180 degrees, etc. Such rotation may be used to align the apertures with different portions of the substrate, which may enable the rotation of the substrate during a duty cycle to be utilized as a tuning knob to improve co-planarity across the substrate.

In some embodiments, an alignment of the substrate may be adjusted relative to the paddle. For example, the substrate may be rotated and/or otherwise adjusted within the vessel to change the alignment of the apertures. The substrate may be de-plated within the same chemistry within the vessel. For example, the waveform of the current may be reversed after a portion of the duty cycle to de-plate high regions (such as sparse regions) of the substrate. In some embodiments, this may be done with the substrate in the same orientation relative to the paddle. In other embodiments, the de-plating process may involve adjusting the orientation of the substrate relative to the paddle before and/or during the de-plating current is applied. For example, the paddle may be in a first orientation (such as with the apertures aligned with the dense regions) for a predetermined portion of a duty cycle (e.g., between or about 50% and 99% of the duty cycle, between or about 60% and 90% of the duty cycle, or between or about 70% and 80% of the duty cycle) the paddle may be in a first orientation relative to the substrate. The orientation may be adjusted to a second orientation (such as with the apertures aligned with the sparse regions) and the remainder of the duty cycle may be completed with the waveform of the current reversed relative to the current used to plate the substrate. This may enable the sparse regions to be de-plated to lower the deposition height at such regions of the substrate, which may help improve the co-planarity across the substrate. In some embodiments, the plating current waveform and/or de-plating current waveform may be synchronized with the translation of the paddle and/or any angular motion (e.g., rotation) of the substrate during the respective process. The plating current density may be the same and/or different than the de-plating current density. For example, in some embodiments, the de-plating current density may be higher or lower than the plating current density.

In some embodiments, method 900 may include producing and/or selecting a paddle for use in electroplating a substrate with a given die pattern (e.g., arrangement of vias and/or pillars). For example, a die pattern may be provided and analyzed to identify features of the die pattern. For example, sizes, shapes, locations, densities, and/or other characteristics of the die pattern may be identified. Based on the die pattern information, a paddle design may be generated. For example, based on the sizes, shapes, locations, densities, and/or other characteristics of the die pattern, an electroplating deposition height profile may be modeled. Based on the modeled height profile, additional computer modeling may be used to size, shape, and position a number of apertures for the paddle design to even out the predicted deposition heights across the substrate. Once designed, the paddle may be fabricated. For example, the paddle may be 3D printed, molded, machined, and/or otherwise manufactured. In some embodiments, the modeling may have sufficient data to generate an effective paddle design in a single design operation. In other embodiments, the fabricated paddle may be used in a number of test electroplating operations to determine how effective the paddle design is at improving the co-planarity across a substrate. A number of iterative steps involving designing, fabricating, testing, and refining the paddle may be performed to design the final paddle used in electroplating operations.

By utilizing a paddle that selectively shields sparse regions from the electric field and apertures that enable the electric field to pass through to dense regions of the substrate, embodiments may enable plating heights/rates to be maintained in dense regions, while reducing the plating heights/rates in sparse regions. Additionally, the translation of the paddle within the vessel may help further improve the non-uniformity of plating on substrates. Therefore, such paddles may be used to improve co-planarity of substrates during electroplating operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a region" includes a plurality of such regions, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of electroplating a substrate, comprising:
   placing a substrate into contact with liquid electrolyte in a vessel;
   conducting ionic current through the liquid electrolyte; and
   moving a paddle within the liquid electrolyte below the substrate with a horizontal movement that selectively shields a portion of the substrate, wherein:
   the paddle comprises a plate that is characterized by a first surface and a second surface, the first surface of the plate comprising a plurality of ribs that extend upward from the first surface of the plate;
   portions of the plate extend between adjacent ribs of the plurality of ribs along a length of the adjacent ribs to form a solid base between the adjacent ribs;
   the plurality of ribs are arranged in a generally parallel manner about the first surface of the plate;
   the paddle defines a plurality of apertures through a thickness of the paddle;
   the plurality of apertures collectively form an open area of less than about 15% of a total area of the paddle; and
   each of the plurality of apertures has a diameter of less than about 10 mm.

2. The method of electroplating a substrate of claim 1, further comprising:
   rotating the substrate while the ionic current is being conducted through the liquid electrolyte.

3. The method of electroplating a substrate of claim 1, further comprising:
   adjusting an alignment of the substrate relative to the paddle; and
   de-plating the substrate within the vessel.

4. The method of electroplating a substrate of claim 1, further comprising:
   identifying a die pattern of the substrate, the die pattern comprising a plurality of dense regions and a plurality of sparse regions; and
   fabricating the paddle and placing the paddle within the vessel prior to placing the substrate in contact with the liquid electrolyte, wherein each of the plurality of apertures is generally aligned with one of the dense regions.

5. The method of electroplating a substrate of claim 1, wherein:
   each of the plurality of apertures extends from the second surface through a top surface of a respective one of the plurality of ribs.

6. The method of electroplating a substrate of claim 1, wherein:
   the paddle comprises a plurality of vertical dividers extending transversely between each of the plurality of ribs; and
   each of the plurality of apertures extends from the second surface through a top surface of a respective one of the plurality of vertical dividers.

7. The method of electroplating a substrate of claim 1, wherein:
   the horizontal movement comprises translation of the paddle back and forth horizontally within a paddle travel dimension.

8. The method of electroplating a substrate of claim 1, wherein:
   conducting ionic current through the liquid electrolyte causes the substrate to be plated; and
   the method further comprises de-plating the substrate within a same chemistry as the substrate is plated.

9. The method of electroplating a substrate of claim 8, wherein:
   a waveform of the ionic current is reversed after a portion of a duty cycle to de-plate regions of the substrate characterized by a reduced density of pillars.

10. The method of electroplating a substrate of claim 9, wherein:
    the portion of the duty cycle comprises between about 60% and 90% of the duty cycle.

11. The method of electroplating a substrate of claim 8, wherein:
    an orientation of the substrate is adjusted from a first position during plating of the substrate to a second position during de-plating of the substrate.

12. The method of electroplating a substrate of claim 1, further comprising:
    moving a wafer holder to position the substrate within the vessel; and
    a distance between the paddle and a face of the wafer holder is less than about 10 mm.

13. The method of electroplating a substrate of claim 1, wherein:
    a position of each of the plurality of apertures corresponds with a dense region of a die pattern used in electroplating the substrate.

14. The method of electroplating a substrate of claim 1, wherein:

the plurality of apertures collectively form an open area of less than about 5% of a total area of the paddle.

15. The method of electroplating a substrate of claim 1, wherein:
each of the plurality of apertures has a diameter of between 3 mm and 7 mm.

16. The method of electroplating a substrate of claim 1, wherein:
a distance between adjacent apertures is between 10 mm and 20 mm.

17. The method of electroplating a substrate of claim 1, wherein:
i) each of the plurality of apertures extends from the second surface through a top surface of a respective one of the plurality of ribs; or
ii) the paddle comprises a plurality of vertical dividers extending transversely between each of the plurality of ribs, and each of the plurality of apertures extends from the second surface through a top surface of a respective one of the plurality of vertical dividers.

18. The method of electroplating a substrate of claim 1, wherein:
the plate defines a plurality of openings that extend from the first surface to the second surface, each opening of the plurality of openings being defined between a pair of adjacent ribs of the plurality of ribs.

19. The method of electroplating a substrate of claim 1, wherein:
the horizontal movement comprises oscillation of the paddle with a stroke that is between 0.5× to 1× a distance of a pitch between adjacent ribs of the plurality of ribs.

20. The method of electroplating a substrate of claim 18, wherein:
the plurality of openings comprises a number of slots formed between at least some of the plurality of ribs.

* * * * *